United States Patent
Shin et al.

(10) Patent No.: US 11,661,656 B2
(45) Date of Patent: May 30, 2023

(54) THIN FILM FORMING APPARATUS AND RADICAL UNIT FOR FORMING THIN FILM

(71) Applicant: EQ TECH PLUS CO., LTD., Suwon-si (KR)

(72) Inventors: Dong Hwa Shin, Suwon-si (KR); Yong Weon Kim, Suwon-si (KR)

(73) Assignee: EQ TECH PLUS CO., LTD., Suwon-si (KR)

( * ) Notice: Subject to any disclaimer, the term of this patent is extended or adjusted under 35 U.S.C. 154(b) by 0 days.

(21) Appl. No.: 17/136,479

(22) Filed: Dec. 29, 2020

(65) Prior Publication Data

US 2021/0222301 A1    Jul. 22, 2021

(30) Foreign Application Priority Data

Jan. 22, 2020  (KR) .................. 10-2020-0008879

(51) Int. Cl.
  *C23C 16/40*   (2006.01)
  *C23C 16/54*   (2006.01)
  *C23C 16/455*  (2006.01)
  *C23C 16/458*  (2006.01)
  *C23C 16/44*   (2006.01)

(52) U.S. Cl.
  CPC .......... *C23C 16/54* (2013.01); *C23C 16/4582* (2013.01); *C23C 16/45565* (2013.01); *C23C 16/4404* (2013.01)

(58) Field of Classification Search
  CPC .............. C23C 16/54; C23C 16/45565; C23C 16/4582; C23C 16/4404; C23C 16/45574; C23C 16/45568; C23C 16/452; C23C 16/45544

USPC ................. 118/715; 156/345.33, 345.34
See application file for complete search history.

(56) References Cited

U.S. PATENT DOCUMENTS

| | | | |
|---|---|---|---|
| 8,512,509 B2 * | 8/2013 | Bera | H01J 37/3244 422/186.04 |
| 2011/0253044 A1 * | 10/2011 | Tam | B05B 1/18 118/666 |
| 2011/0256729 A1 * | 10/2011 | Goodlin | C23C 16/45565 438/758 |

(Continued)

FOREIGN PATENT DOCUMENTS

| | | |
|---|---|---|
| CN | 103168344 A | 6/2013 |
| JP | H08291385 A | 11/1996 |

(Continued)

*Primary Examiner* — Rudy Zervigon
(74) *Attorney, Agent, or Firm* — Dinsmore & Shohl LLP

(57) ABSTRACT

According to an embodiment of the present disclosure, a thin film forming apparatus includes a chamber, a plurality of gas inlets that are formed at an upper portion of the chamber and receive at least two reaction gas and precursors for radical reaction, and a radical unit configured to generate radicals by reacting the reaction gas provided through the gas inlet and deposit a thin film on a substrate by spraying the radicals and the precursors downward. The radical unit is configured with a plurality of plates, a precursor spray path is configured to be sprayed from the radical unit after the precursors are sprayed to a plurality of paths greater than precursor spray paths of the gas inlet in an uppermost plate among the plurality of plates, and a reaction gas spray path is configured not to overlap with the precursor spray path.

20 Claims, 3 Drawing Sheets

(56) References Cited

U.S. PATENT DOCUMENTS

| | | | | |
|---|---|---|---|---|
| 2012/0152171 | A1* | 6/2012 | Lee | C23C 16/45574 118/730 |
| 2015/0004313 | A1* | 1/2015 | Byun | C23C 16/45574 427/248.1 |
| 2015/0007770 | A1* | 1/2015 | Chandrasekharan | C23C 16/45572 239/548 |

FOREIGN PATENT DOCUMENTS

| | | |
|---|---|---|
| JP | 2004111506 A | 4/2004 |
| JP | 2009016624 A | 1/2009 |
| JP | 2010219561 A | 9/2010 |
| JP | 2012519956 A | 8/2012 |
| JP | 2015056633 A | 3/2015 |
| JP | 2015225856 A | 12/2015 |
| KR | 1020090021032 A | 2/2009 |
| KR | 101265905 B1 | 5/2013 |
| KR | 1020130135261 A | 12/2013 |
| KR | 101619308 B1 | 5/2016 |
| KR | 101765244 B1 | 7/2017 |
| KR | 1020170075163 A | 7/2017 |

\* cited by examiner

THIN FILM FORMING APPARATUS AND RADICAL UNIT FOR FORMING THIN FILM

CROSS-REFERENCE TO RELATED APPLICATION

This application claims priority to and the benefit of Korean Patent Application No. 10-2020-0008879 filed in the Korean Intellectual Property Office on Jan. 22, 2020, the entire contents of which are incorporated herein by reference.

TECHNICAL FIELD

The present disclosure relates to a thin film forming apparatus with a deposition (CVD or ALD) technology, more particularly, a radical unit that effectively performs deposition by spraying precursors and reaction gas together on an upper portion inside an apparatus chamber.

BACKGROUND ART

Atomic layer deposition (ALD) refers to a nano-thin film deposition technology using the phenomenon of a chemically attached monoatomic layer during a semiconductor manufacturing process. By alternating adsorption and substitution of molecules on a wafer surface, it is possible to deposit ultrafine interlayers of atomic layer thickness, and to stack oxide and metal thin films as thin as possible.

In addition, there may be chemical vapor deposition (CVD) as another method used in semiconductor manufacturing processes or the like. The chemical vapor deposition refers to a deposition method in which a gaseous component is injected into a chamber and a chemical reaction that gives energy such as heat, plasma, and light is excited or accelerated to synthesize a thin film or particle, and adsorb and deposit results on the surface of a substrate.

In particular, in order to perform high-quality atomic layer deposition or chemical vapor deposition, mixing and uniform spraying of precursors and reaction gas is essential. However, in an atomic layer deposition apparatus in the related art, there is a limitation in that the spray directions of the precursors and the reaction gas are different in a chamber in which the deposition on the substrate is performed and gases do not reach the depth of the pattern of the substrate such that uniform deposition is not performed and manufacturing of a high-quality thin film is difficult.

DISCLOSURE

Technical Solution

An object of the present disclosure is to ensure that mixing and reaction processes are appropriately performed and reaction gas is uniformly sprayed on a substrate located in a chamber before the reaction gas is sprayed into the chamber through a radical unit in which precursors and reaction gas are sprayed together.

According to an embodiment of the present disclosure, a thin film forming apparatus may be configured to include a chamber, a plurality of gas inlets that are formed at an upper portion of the chamber and receive at least two reaction gas and precursors for radical reaction, and a radical unit configured to generate radicals by reacting the reaction gas provided through the gas inlet and deposit a thin film on a substrate by spraying the radicals and the precursors downward, in which the radical unit is configured with a plurality of plates, a precursor spray path is configured to be sprayed from the radical unit after the precursors are sprayed to a plurality of paths greater than precursor spray paths of the gas inlet in an uppermost plate among the plurality of plates, and a reaction gas spray path is configured not to overlap with the precursor spray path.

In addition, the precursor spray path may be configured to be sprayed by vertically penetrating at least one plates among the remaining plates after the precursors are sprayed by horizontally in the uppermost plate.

In addition, the precursor spray path in the uppermost plate may be formed in a radial structure from a center of the uppermost plate to which the precursors are injected.

In addition, the precursor spray paths formed in the radial structure in the uppermost plate may be configured in a form in which a plurality of straight tubes having a predetermined length cross each other by sharing center, the spray holes are formed by being spaced apart at regular intervals on each of the straight tubes, and each of the spray holes vertically penetrates the remaining plates, whereby the precursors may be sprayed.

In addition, the reaction gas may be sprayed in a plate in which the reaction gas spray path is located below a layer to which the precursors are sprayed.

In addition, the plate in which the reaction gas is sprayed by the reaction gas spray path, may be formed in a multiple showerhead structure.

In addition, the multiple showerhead structure may be configured with two or more plates, and the spray holes formed in the plate may be arranged at positions that deviate from each other.

In addition, a predetermined plate located in the middle among the plurality of plates configuring the reaction gas spray path may configure a space capable of mixing different reaction gases injected through the plurality of gas inlets.

In addition, the radical unit may be provided as a form in which a first plate, a second plate, a third plate, a fourth plate, a fifth plate, a sixth plate, and a seventh plate are sequentially stacked, and the radical unit may be configured in a form in which the first plate corresponding to an uppermost layer to the seventh plate corresponding to a lowermost layer are stacked with each other.

In addition, the first gas inlet to which the precursors are injected may be formed to vertically penetrate the first plate by being formed in the center of an upper surface of the first plate.

In addition, a first precursor spray path connected to the first gas inlet and having a predetermined radical structure for spraying the injected precursors may be provided horizontally inside the first plate, and a plurality of discharge holes for discharging the precursor may be formed at predetermined intervals in the first precursor spray path.

In addition, a second precursor spray path connected vertically to the plurality of the discharge holes provided in the first precursor spray path may be provided, and the second precursor spray path may have a structure coupled with the discharge hole for discharging the precursor provided in the seventh plate by penetrating vertically the second plate to a sixth plate.

In addition, a second gas inlet to which the reaction gas is injected may have a structure connected to the third plate for spraying the reaction gas by being formed as a plurality at a predetermined position on an upper surface of the first plate and penetrating vertically the first plate to the second plate.

In addition, a first reaction gas spray path having a predetermined path for flowing the injected reaction gas by being connected to the second gas inlet may be provided horizontally inside the third plate, and one side of an upper surface of the first reaction gas spray path is connected to the second gas inlet and the discharge hole for discharging the reaction gas may be formed at a predetermined position of the other side of a rear surface.

In addition, a second reaction gas spray path for flowing additionally the injected reaction gas in the fourth plate by being connected to the first reaction gas spray path may be provided horizontally inside the fourth plate, and while the second reaction gas spray path has a different form from the first reaction gas spray path, one end of an upper portion of the second reaction gas spray path may be connected to the discharge hole of the first reaction gas spray path and the plurality of the discharge holes for discharging the reaction gas may be formed at predetermined intervals at a rear portion.

In addition, when the second gas inlets to which different types of reaction gases are injected are provided in more than a predetermined number, the different types of reaction gases may be injected to a specific first reaction gas spray path by being connected to a plurality of the second gas inlets.

In addition, the radical unit may have a structure in which the sixth plate is disposed inside a space by being provided with a structure having a predetermined space when the fourth plate, the fifth plate, and the seventh plate are coupled, and the sixth plate may be supported by a flow path for spraying the precursor.

In addition, the seventh plate coupled with a rear portion of the fifth plate may include the plurality of the discharge holes for discharging the precursor and the reaction gas, and a hole for discharging the precursor and a hole for discharging the reaction gas may be provided to deviate each other while the plurality of the discharge holes are configured to form a concentric circle at a predetermined position.

In addition, while a plurality of holes for discharging the precursors and the reaction gas are configured to form a concentric circle at a predetermined position in the sixth plate, the hole for discharging the reaction gas may be provided at a position different from the hole for discharging the reaction gas provided in the seventh plate.

In addition, a radical unit for forming a thin film may include a plurality of gas inlets that are formed at an upper portion of a chamber and receive at least two reaction gas and precursors for radical reaction, and a radical unit configured to generate radicals by reacting the reaction gas provided through the gas inlet and deposit a thin film on a substrate by spraying the radicals and the precursors downward, in which the radical unit may be configured with a plurality of plates, a precursor spray path is configured to be sprayed from the radical unit after the precursors are sprayed to a plurality of paths greater than precursor spray paths of the gas inlet in an uppermost plate among the plurality of plates, and a reaction gas spray path is configured not to overlap with the precursor spray path.

Advantageous Effects

According to an embodiment of the present disclosure, through a radical unit configured with a multilayer structure, before two or more reaction gases are sprayed into a chamber, appropriate mixing and reaction processes may be performed, and the gas may be uniformly sprayed on a substrate provided in the chamber.

When a predetermined uneven pattern is present on the substrate, it is possible to form a highly precise thin film in a case where the precursors are deeply diffused/sprayed from the upper portion to the lower portion of uneven patterns. In the related art, since the precursors are sprayed on both sides of the substrate, a very high density or high pressure precursors are inserted. However, according to an embodiment of the present disclosure, since the precursors are sprayed together with radicals above the substrate, the precursors may be sprayed deeply to every corner of the upper and lower portions of the pattern such that it is possible to improve loading effect.

DETAILED DESCRIPTION OF EMBODIMENTS

Figure 1:
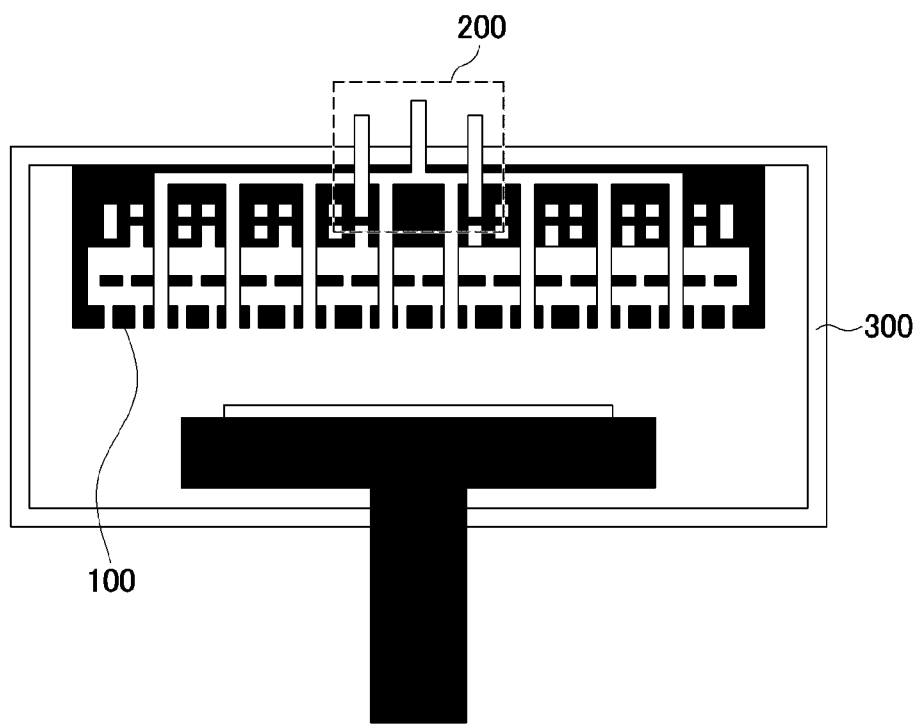
FIG. 1 is a sectional view illustrating a schematic form of a deposition apparatus according to an embodiment of the present disclosure.

Hereinafter, exemplary embodiments of the present disclosure will be described in detail with reference to the accompanying drawings so that those of ordinary skill in the art may easily implement the present disclosure. However, the present disclosure may be implemented in various different forms and is not limited to the embodiments described herein. In the drawings, parts irrelevant to the description are omitted in order to clearly describe the present disclosure, and similar reference numerals are attached to similar parts throughout the specification.

Throughout the specification, when a part is said to be "connected" to another part, this includes the case of being "directly connected". In addition, when a part "includes" a certain component, it means that other components may be further included, and one or more other features, not excluding other components, unless specifically stated to the contrary. It is to be understood that it does not preclude the presence or addition of any number, step, action, component, part, or combination thereof.

The following examples are detailed descriptions for aiding understanding of the present disclosure, and do not limit the scope of the present disclosure. Therefore, the invention of the same scope performing the same function as the present disclosure will also belong to the scope of the present disclosure.

FIG. 1 is a sectional view illustrating a schematic form of a deposition apparatus according to an embodiment of the present disclosure.

Referring to FIG. 1, the deposition apparatus may be configured with a radical unit 100, a gas inlet 200, and a chamber 300.

According to the embodiment of the present disclosure, the deposition apparatus may be configured to perform deposition on a substrate located inside the chamber 300 by generating radicals by reacting reaction gas provided through the gas inlet 200, and spraying the radicals and precursors through the radical unit 100.

At this time, the radical unit 100 may be provided to include a plurality of plates. For example, the plates having a predetermined thickness are stacked on each other, a tube through which the reaction gas and precursors may flow vertically or horizontally, or a space in which the reaction gas may be mixed and reacted, is formed.

At this time, a precursor spray path formed in the radical unit 100 may have a structure in which the precursors are sprayed vertically to a lowermost plate after spraying in an uppermost plate among the plurality of plates. In a case where the precursors with low thermal stability are sprayed in a lowermost layer close to a heat source such as a heater, according to the decomposition of the precursors, since composition of a thin film is changed due to gas phase reaction and adsorption characteristics change, it is preferable that the precursors are sprayed in an uppermost layer due to the non-uniform diffusion of upper and lower patterns on the substrate and the quality deterioration of the thin film according to the generation of particles.

Although the precursors are injected through one or more gas inlets 200 of the uppermost plate, it is formed so that the precursors are evenly sprayed and sprayed to the radical unit 100 through a tube provided inside the uppermost plate.

In addition, a reaction gas spray path formed in the radical unit 100 may be configured not to overlap with the precursor spray path described above and may be configured to spray by mixing different reaction gases inside.

In addition, the precursor spray path may be configured in a form in which the precursors vertically penetrate the remaining plate after spraying in the uppermost plate.

At this time, the precursor spray path provided inside the uppermost plate may be formed in a radial structure in the center of the uppermost plate through which the precursors are injected. The precursor spray path may be changed according to a shape of the radical unit 100.

In more detail this, the precursor spray path formed radially in the uppermost plate has a radial shape in which a plurality of straight tubes having a predetermined length cross each other by sharing a center.

In addition, the spray holes may be formed to be spaced apart at regular intervals on each straight tube the precursor spray path formed in the radial shape, and each spray hole may be formed to vertically penetrate the remaining plates. By doing this, the precursors may be uniformly sprayed on the substrate.

At this time, in the reaction gas spray path, the reaction gas may be sprayed in a plate located below a layer in which the precursors are sprayed. For example, the reaction gas spray path is formed in a plate located lower than the uppermost plate, and the reaction gas is sprayed inside the radical unit 100.

In addition, in a case of the plate in which the reaction gas is sprayed through the reaction gas spray path, the plate may be formed in a multiple showerhead structure.

At this time, the multiple showerhead structure may mean a structure in which the radical unit 100 is configured with two or more plates and the spray holes of the reaction gas formed on each plate are arranged at position where they are deviate each other.

In addition, a predetermined plate located in the middle of the plates among the plurality of plates configuring the reaction gas spray path may include a predetermined space for mixing and reacting the reaction gases reacting differently injected through a plurality of gas inlets 200.

The gas inlet 200 according to the embodiment of the present disclosure may be provided on an upper portion of the chamber 300, and a plurality of the gas inlets may be provided to receive at least two the reaction gas and the precursors for radical reaction.

For example, although the precursors may be provided through one gas inlet 200, when various types of the reaction gases are required for the deposition, at least two or more gas inlets 200 are required in addition to the gas inlet 200 of the precursor.

A susceptor or the like on which the radical unit 100 connected to the gas inlet 200 and the substrate are mounted, may be provided inside the chamber 300.

Accordingly, the precursors and the reaction gas injected into the chamber 300 through the gas inlet 200 are mixed inside the radical unit 100, and the precursors and the reaction gas are sprayed on the substrate located at the bottom of the radical unit 100.

Figure 2:
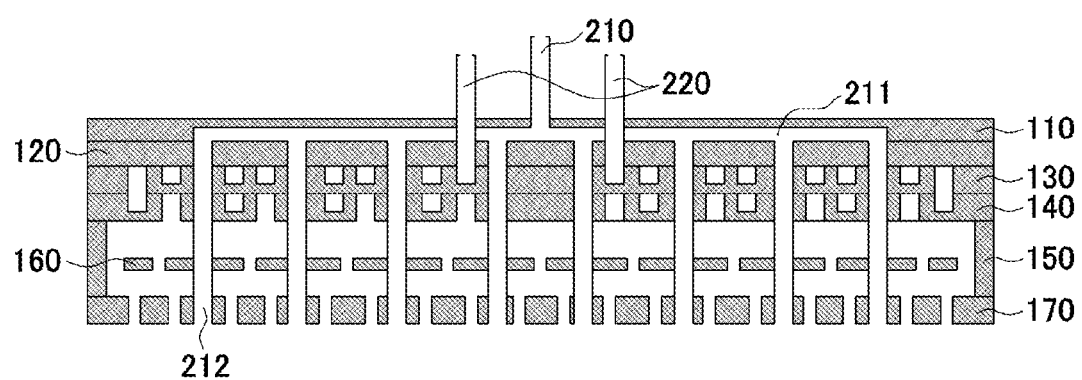
FIG. 2 is a sectional view illustrating a schematic form of a radical unit according to the embodiment of the present disclosure.

FIG. 2 is a sectional view illustrating a schematic form of a radical unit according to the embodiment of the present disclosure.

A structure of the radical unit 100 suggested in FIG. 2 of the present specification may correspond to one of the embodiments for smoothly describing the present disclosure. Accordingly, since the number of the plates configuring the radical unit 100 and the location and the path of the gas inlet 200 are varied according to a type of the deposition apparatus, they are not limited to the scope of the present disclosure.

Referring to FIG. 2, the radical unit 100 may be configured with a first plate 110, a second plate 120, a third plate 130, a fourth plate 140, a fifth plate 150, a sixth plate 160, and a seventh plate 170. At this time, the first plate 110 (uppermost layer) to the seventh plate 170 (lowermost layer) are coupled in a stacked form. In addition, at least two or more first gas inlet 210 and second gas inlets 220 may be provided on an upper surface of the first plate 110.

According to the embodiment of the present disclosure, the first gas inlet 210 is configured to inject the precursors to the radical unit 100, be formed in the center of an upper surface of the first plate 110, and penetrate vertically the first plate 110.

At this time, a tube for spraying the precursors inside the radical unit 100 by being connected to the first gas inlet 210 will be described with reference to FIG. 3 to FIG. 6 (which will be described below).

The second gas inlet 220 according to the embodiment of the present disclosure may inject the reaction gas to the radical unit 100, and may be provided in plural at a predetermined position on the upper surface of the first plate 110.

At this time, the number of the second gas inlets 220 and the plates is related to types and the number of the reaction gases using in the deposition, and positions provided are based on a size or shape of the radical unit 100, the number of the injected reaction gases, and the like.

In addition, the second gas inlet 220 has a structure that penetrates vertically the first plate 110 to the second plate 120 and is connected the third plate 130 to which the reaction gas is sprayed.

At this time, a tube that is connected to the first gas inlet 210 and sprays the precursors inside the radical unit 100 will be described additionally in FIG. 3 (which will be described below).

Figure 3:
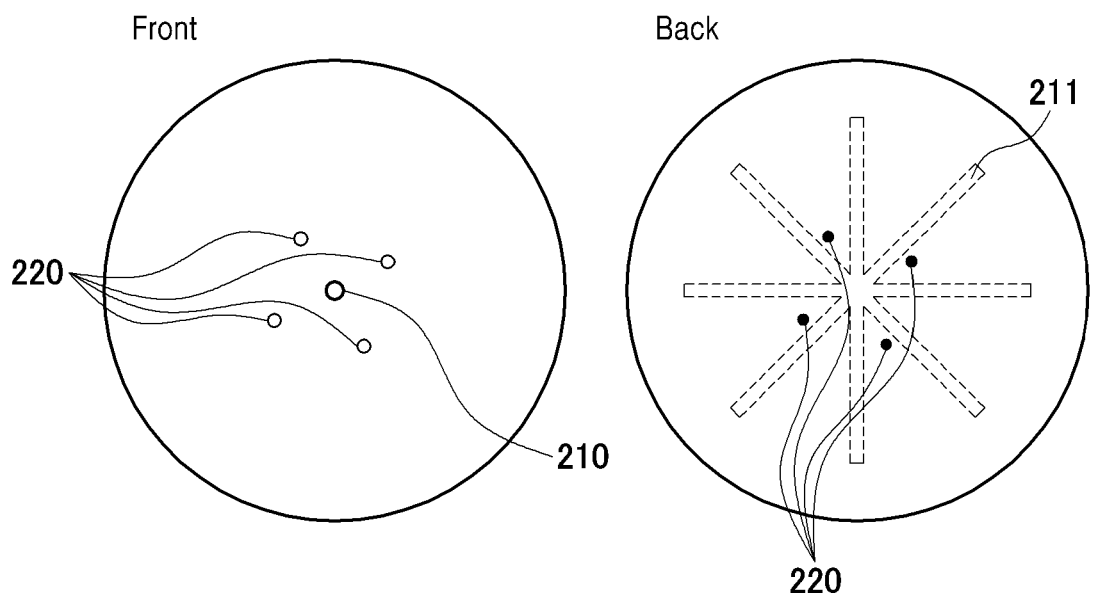
FIG. 3 is a diagram illustrating an upper surface and a rear surface of a first plate configuring the radical unit according to the embodiment of the present disclosure.

FIG. 3 is a diagram illustrating an upper surface and a rear surface of the first plate configuring the radical unit according to the embodiment of the present disclosure.

Referring to FIG. 3, it may be confirmed through a diagram for a rear part (see Back drawing) that the first gas inlet 210 is formed in the center of an upper surface of the first plate 110 (see Front drawing), and the first precursor spray path 211 is formed inside.

At this time, the first precursor spray path 211 is formed with a horizontal predetermined radial structure for spraying the injected precursors by being connected to the first gas inlet 210.

In addition, the first precursor spray path 211 is connected to a plurality of discharge holes for spraying the precursors and a plurality of the discharge holes are connected to a second precursor spray path 212 (which will be described below) such that the precursors may be sprayed on the substrate through the first and second precursor spray paths 211 and 212.

As a further embodiment, the first precursor spray path 211 may be provided in another form capable of spraying the precursors corresponding to the shape of the radical unit 100. For example, the path may be provided as a circular or swirl-shaped tube instead of the radial shape.

As a still further embodiment, when the first precursor spray path 211 has a protruding structure with a predetermined height in a rear part of the first plate 110, the discharge hole may be provided on a side of the first precursor spray path 211. The discharge holes are formed to be spaced apart at predetermined intervals and formed at positions corresponding to the radial structure of the first precursor spray path 211.

Unlike the first precursor spray path 211, the second gas inlet 220 does not perform horizontal spray in the first plate 110 and is extended to the second plate 120 by penetrating the first plate 110.

Figure 4:
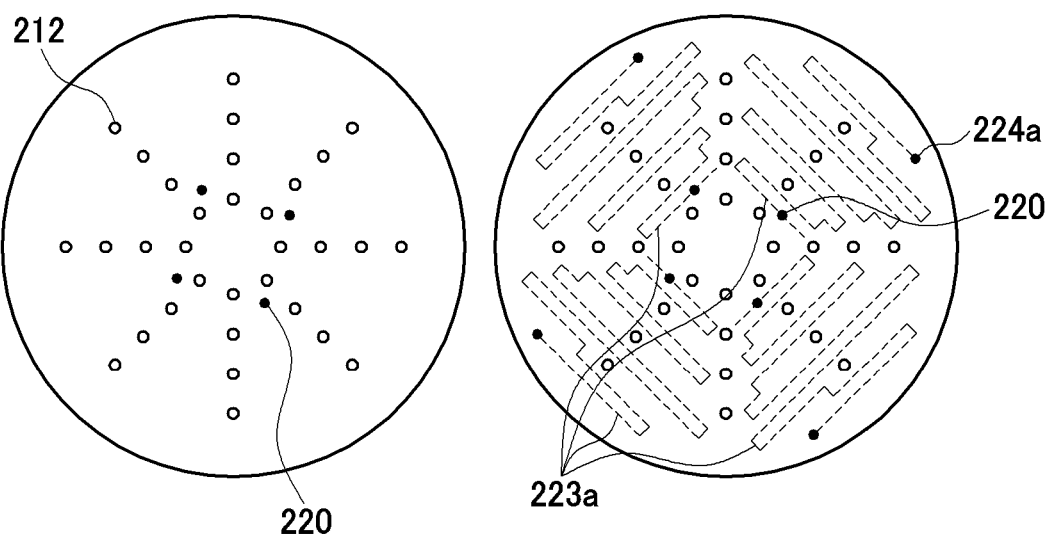
FIG. 4 is a top view illustrating second and third plates configuring the radical unit according to the embodiment of the present disclosure.

FIG. 4 is a top view illustrating the second and third plates configuring the radical unit according to the embodiment of the present disclosure.

Referring to FIG. 4, gas spray paths formed in the second plate 120 and the third plate 130 may be checked.

First, the second precursor spray path 212 vertically connected to the discharge hole of the first precursor spray path 211 is provided in the second plate 120. Referring to FIG. 2, the second precursor spray path 212 has a structure that extends vertically to the lowermost plate.

At this time, the second precursor spray path 212 has a structure coupled with the discharge hole for discharging the precursors provided in the seventh plate 170 by penetrating vertically the second plate to the sixth plate 120 to 160.

In addition, the second plate 120 and the third plate 130 have a structure in which the second gas inlet 220 formed on an upper surface of the first plate 110 vertically penetrates the second plate 120 and is connected to the third plate for spraying the reaction gas.

At this time, a first reaction gas spray path 223a that is connected to the second gas inlet 220 and has a predetermined path for flowing the injected reaction gas, may be provided horizontally inside the third plate 130.

At this time, one side of an upper surface of the first reaction gas spray path 223a is connected to the second gas inlet, and discharge holes 224a for discharging the reaction gas are formed at predetermined positions of the other side of a rear surface. The first reaction gas spray path 223a may be configured to include a plurality of the spray paths, and the number of the spray paths may not be limited according to an embodiment of the disclosure.

In an optional embodiment, when a predetermined number or more second gas inlets 220 into which different types of reaction gases are injected are provided, a plurality of second gas inlets 220 are provided in a specific first reaction gas spray path 223a such that different types of reaction gases may be injected. At this time, the plurality of second gas inlets 220 connected to the specific first reaction gas spray path 223a may be connected to a first reaction gas spray path 223a by being spaced apart from each other by a predetermined interval. For example, when eight second gas inlets 220 are provided, four first reaction gas spray paths 223a may be provided, and may be arranged to correspond two second gas inlets 220 to one side of each of the first reaction gas spray paths 223a. At this time, different types of the reaction gases may be injected into the two second gas inlets 220. In this case, since mixing occurs from the moment the reaction gas is injected and the longer the reaction gas spray path, the longer the mixing and reaction times, the opportunity to generate the radicals increases. Meanwhile, as illustrated in the figure, when four second gas inlets 220 are provided and four first reaction gas spray paths 223a are provided such that they correspond to each other one-to-one, mixing is not performed from the moment of injection, and mixing may be performed in an open space such as the fifth plate 150.

Figure 5:
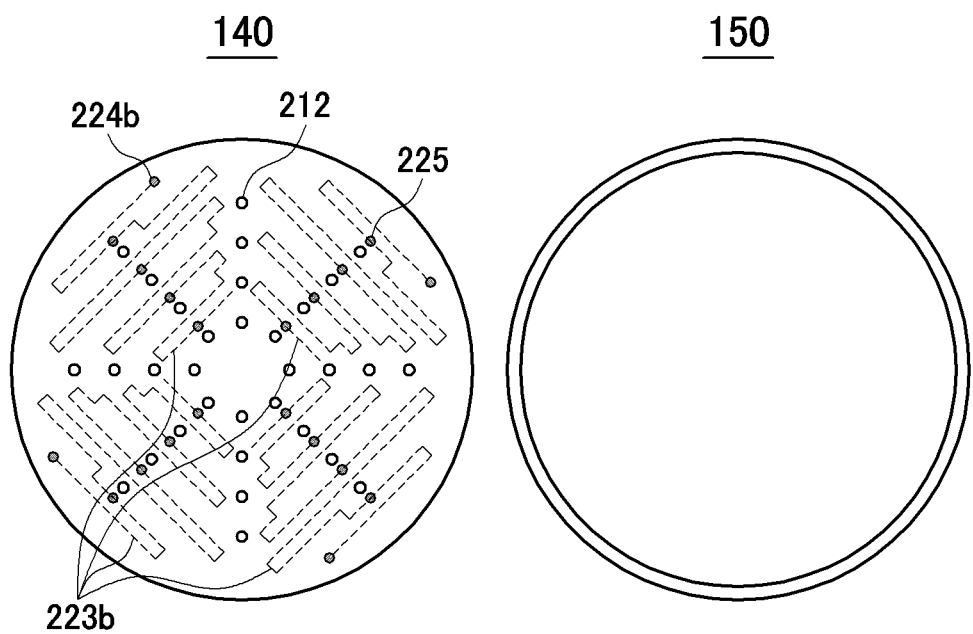
FIG. 5 is a top view illustrating fourth and fifth plates configuring the radical unit according to the embodiment of the present disclosure.

FIG. 5 is a top view illustrating fourth and fifth plates 140 and 150 configuring the radical unit according to the embodiment of the present disclosure.

Referring to FIG. 5, structures of the fourth plate 140 and the fifth plate 150 may be checked.

Inside the fourth plate 140, a second reaction gas spray path 223b that is connected to the first reaction gas spray path 223a and has a predetermined path for flowing additionally the injected reaction gas may be horizontally provided.

At this time, the second reaction gas spray path 223b has a different type of path from the first reaction gas spray path 223a. That is, the reaction gas flowing through the first reaction gas spray path 223a flows additionally through the second reaction gas spray path 223b.

At this time, a spray hole 224a and a spray hole 224b are coupled with each other such that the first reaction gas spray path 223a and the second reaction gas spray path 223b are connected to each other.

In addition, a plurality of the discharge holes 225 for discharging the reaction gas may be formed at predetermined intervals on a rear surface of the second reaction gas spray path 223b. For example, since the plurality of the discharge holes 225 may be arranged in the radial shape on a plurality of second reaction gas spray paths 223b by being arranged in a straight line on the second reaction gas spray path 223b.

In addition, since the fifth plate 150 is formed in a ring shape, when the fourth plate 140, the fifth plate 150, and the seventh plate 170 are coupled with each other, a structure having a predetermined empty space may be provided.

Figure 6:
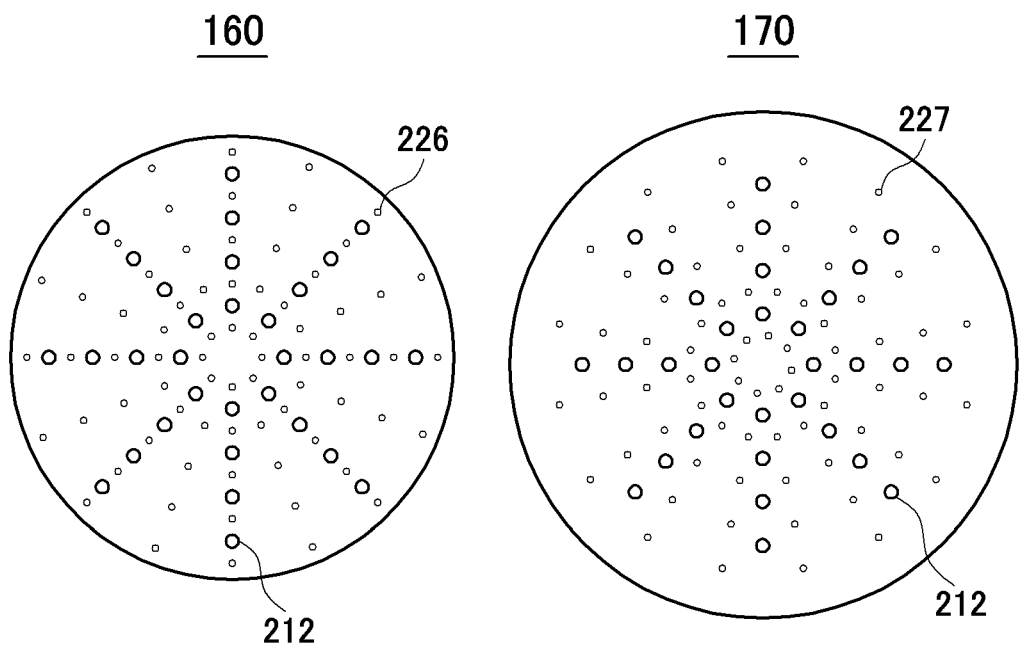
FIG. 6 is a top view illustrating sixth plate and seventh plate configuring the radical unit according to the embodiment of the present disclosure.

FIG. 6 is a top view illustrating the sixth plate and seventh plate configuring the radical unit according to the embodiment of the present disclosure.

Referring to FIG. 6, structures of the sixth plate 160 and the seventh plate 170 may be checked.

The sixth plate 160 may be formed with a structure in which the plate is disposed in an empty space generated by coupling the fourth plate 140 to the seventh plate 170. The sixth plate 160 is formed in a structure having a diameter smaller than that of the seventh plate 170.

At this time, the sixth plate 160 may be supported by a pillar formed by the second precursor spray path 212 for spraying the precursors by being disposed between the fourth plate 140 and the seventh plate 170, or and may be supported by a spacer (not illustrated) formed between the sixth plate 160 and the seventh plate 170 although not illustrated in the drawing.

The plurality of the discharge holes 226 and 227 for spraying the precursors and the reaction gas may be formed in the sixth plate 160 and the seventh plate 170, respectively.

At this time, in a case of the sixth plate 160, the plurality of the discharge holes 226 are configured to form a concentric circle at a predetermined position, and a second precursor spray path 212 for discharging the precursors and the discharge hole 226 for discharging the reaction gas may be configured to deviate each other.

In addition, in a case of the seventh plate 170, the plurality of the discharge holes 227 may be formed while forming a concentric circle at predetermined positions.

At this time, after mixing the reaction gas, in order to discharge the mixed gas from the radical unit 100, the discharge hole 226 formed in the sixth plate 160 and the discharge hole 227 formed in the seventh plate 170 may be provided at positions that deviate each other when viewing down from the upper surface. That is, when the discharge hole 226 of the sixth plate and the discharge hole 227 of the seventh plate are arranged at positions corresponding to each other, before reacting the reaction gas discharged from the fourth plate 140 to the radicals is radically reacted, the reaction gas may be sprayed as it is by penetrating the discharge hole 226 of the sixth plate and the discharge hole 227 of the seventh plate.

Description of the present disclosure described above are intended to be illustrative, and those of ordinary skill in the art to which the present disclosure pertains will be able to understand that other specific forms may be easily modified without changing the technical spirit or essential features of the present disclosure. Therefore, it should be understood that the embodiments described above are illustrative in all respects and not limiting. For example, each component described as a single type may be implemented in a sprayed manner, and similarly, components described as being sprayed may also be implemented in a combined form.

The scope of the present disclosure is indicated by the claims to be described later rather than the detailed description, and all changes or modifications derived from the meaning and scope of the claims and their equivalent concepts should be interpreted as being included in the scope of the present disclosure.

| Description of Symbols | |
|---|---|
| 100: radical unit | 200: gas inlet |
| 300: chamber | 110: first plate |
| 120: second plate | 130: third plate |
| 140: fourth plate | 150: fifth plate |
| 160: sixth plate | 170: seventh plate |
| 210: first gas inlet | 220: second gas inlet |
| 211: first precursor spray path | 212: second precursor spray path |
| 223a: first reaction gas spray path | 223b: second reaction gas spray path |
| 224a, 224b, 225, 226, 227: discharge hole | |

What is claimed is:

1. A thin film forming apparatus comprising:
a chamber;
a first gas inlet that is formed to vertically penetrate in the center of upper portion of the chamber and receive precursors for radical reaction;
second gas inlets that are formed to vertically penetrate at a predetermined position on an upper portion of the chamber and receive at least two reaction gases for the radical reaction; and
a radical unit generating radicals by reacting the at least two reaction gases provided through the plurality of the gas inlets and deposit a thin film on a substrate by spraying the radicals and the precursors downward,
wherein the radical unit includes a plurality of plates, a plurality of first precursor spray paths are horizontally arranged in an uppermost plate among the plurality of plates such that the precursors are horizontally sprayed to the plurality of first precursor spray paths, a plurality of second precursor spray paths are connected to the plurality of first precursor spray paths and vertically arranged in at least two plates distributing the at least two reaction gases such that the precursors are vertically sprayed by penetrating the at least one plate, and reaction gas spray paths do not overlap with the plurality of the first precursor spray paths and the plurality of the second precursor spray paths,
wherein one of the plurality of plates including a first reaction gas spray path and another of the plurality of plates including a second reaction gas spray path are disposed over a predetermined plate including a space capable of mixing the at least two different reaction gases to generate the radicals,
wherein the reaction gas spray paths comprises the first reaction gas spray path extended horizontally in one of the plurality of plates and the second reaction gas spray path extended horizontally in another of the plurality of plates, and
wherein the first reaction gas spray path is formed horizontally in a zig-zag pattern.

2. The thin film forming apparatus according to claim 1, wherein the plurality of the first precursor spray paths in the uppermost plate is formed in a radial structure from a center of the uppermost plate to which the precursors are injected.

3. The thin film forming apparatus according to claim 1, wherein the plurality of the first precursor spray paths formed in the radial structure in the uppermost plate are in a form in which a plurality of straight tubes having a predetermined length cross each other by sharing center, spray holes are formed by being spaced apart at regular intervals on each of the straight tubes, and each of the spray holes vertically penetrates the remaining plates, whereby the precursors are sprayed.

4. The thin film forming apparatus according to claim 2, wherein the reaction gas is sprayed in a plate in which the reaction gas spray path is located below a layer to which the precursors are sprayed.

5. The thin film forming apparatus according to claim 1, wherein the plate in which the reaction gas is sprayed by the reaction gas spray path, is formed in a multiple showerhead structure.

6. The thin film forming apparatus according to claim 5, wherein the multiple showerhead structure includes two or more plates, and spray holes formed in the plate are arranged at positions that deviate from each other.

7. The thin film forming apparatus according to claim 1,
wherein the radical unit is provided as a form in which a first plate, a second plate, a third plate, a fourth plate, a fifth plate, a sixth plate and a seventh plate are sequentially stacked, and
wherein the radical unit is in a form in which the first plate corresponding to an uppermost layer to the seventh plate corresponding to a lowermost layer are stacked with each other.

8. The thin film forming apparatus according to claim 7,
wherein the first gas inlet to which the precursors are injected is formed to vertically penetrate the first plate by being formed in the center of an upper surface of the first plate.

9. The thin film forming apparatus according to claim 8,
wherein the plurality of the first precursor spray paths connected to the first gas inlet and having a predetermined radical structure for spraying the injected precursors are provided horizontally inside the first plate, and
wherein a plurality of discharge holes for discharging the precursor are formed at predetermined intervals in the plurality of the first precursor spray paths.

10. The thin film forming apparatus according to claim 7,
wherein the plurality of the second precursor spray paths connected vertically to the plurality of the discharge holes provided in the plurality of the first precursor spray paths are provided, and
wherein the plurality of the second precursor spray paths have a structure coupled with the discharge hole for discharging the precursor provided in the seventh plate by penetrating vertically the second plate to a sixth plate.

11. The thin film forming apparatus according to claim 7,
wherein a second gas inlet to which the reaction gas is injected has a structure connected to the third plate for spraying the reaction gas by being formed as a plurality at a predetermined position on an upper surface of the first plate and penetrating vertically the first plate to the second plate.

12. The thin film forming apparatus according to claim 11,
wherein the first reaction gas spray path having a predetermined path for flowing the injected reaction gas by being connected to the second gas inlet is provided horizontally inside the third plate,
wherein the injected reaction gas flows horizontally from an inside of the third plate to an outside of the third plate, and
wherein one side of an upper surface of the first reaction gas spray path is connected to the second gas inlet and the discharge hole for discharging the reaction gas is formed at a predetermined position of the other side of a rear surface.

13. The thin film forming apparatus according to claim 11,
wherein the second reaction gas spray path for flowing additionally the injected reaction gas from in the fourth plate by being connected to the first reaction gas spray path is provided horizontally inside the fourth plate,
wherein the additionally injected reaction gas flows horizontally from an outside of the fourth plate to an inside of the fourth plate, and
wherein, while the second reaction gas spray path has a different form from the first reaction gas spray path, one end of an upper portion of the second reaction gas spray path is connected to the discharge hole of the first reaction gas spray path and the plurality of the discharge holes for discharging the reaction gas are formed at predetermined intervals at a rear portion.

14. The thin film forming apparatus according to claim 12,
wherein when the second gas inlets to which different types of reaction gases are injected are provided in more than a predetermined number, the different types of reaction gases are injected to a specific first reaction gas spray path by being connected to a plurality of the second gas inlets.

15. The thin film forming apparatus according to claim 7,
wherein the radical unit has a structure in which the sixth plate is disposed inside a space by being provided with a structure having a predetermined space when the fourth plate, the fifth plate, and the seventh plate are coupled, and
wherein the sixth plate is supported by a flow path for spraying the precursor.

16. The thin film forming apparatus according to claim 15,
wherein the seventh plate coupled with a rear portion of the fifth plate includes the plurality of the discharge holes for discharging the precursor and the reaction gas, and
wherein a hole for discharging the precursor and a hole for discharging the reaction gas are provided to deviate each other while the plurality of the discharge holes are included to form a concentric circle at a predetermined position.

17. The thin film forming apparatus according to claim 16,
wherein while a plurality of holes for discharging the precursors and the reaction gas are included to form a concentric circle at a predetermined position in the sixth plate, the hole for discharging the reaction gas is provided at a position different from the hole for discharging the reaction gas provided in the seventh plate.

18. A radical unit for forming a thin film comprising:
a first gas inlet that is formed to vertically penetrate in the center of an upper portion of a chamber and receive precursors for radical reaction;
second gas inlets that are formed to vertically penetrate at a predetermined position on an upper portion of the chamber and receive at least two reaction gases for the radical reaction; and
a radical unit generating radicals by reacting the at least two reaction gases provided through the plurality of the gas inlets and deposit a thin film on a substrate by spraying the radicals and the precursors downward,
wherein the radical unit includes a plurality of plates, a plurality of first precursor spray paths are horizontally arranged in an uppermost plate among the plurality of plates such that the precursors are horizontally sprayed to the plurality of first precursor spray paths, a plurality of second precursor spray paths are connected to the plurality of first precursor spray paths and vertically arranged in at least two plates distributing the at least two reaction gases such that the precursors are vertically sprayed by penetrating the at least one plate, and reaction gas spray paths do not overlap with the plurality of the first precursor spray paths and the plurality of the second precursor spray paths,
wherein one of the plurality of plates including a first reaction gas spray path and another of the plurality of plates including a second reaction gas spray path are disposed over a predetermined plate including a space capable of mixing the at least two different reaction gases to generate the radicals, wherein the reaction gas spray paths comprises the first reaction gas spray path extended horizontally in one of the plurality of plates and the second reaction gas spray path extended horizontally in another of the plurality of plates, and wherein the first reaction gas spray path is formed horizontally in a zig-zag pattern.

19. The thin film forming apparatus according to claim 1, wherein a plurality of discharge holes are arranged in a radial shape on a plurality of second reaction gas spray paths by being arranged in a straight line on the second reaction gas spray paths.

20. The thin film forming apparatus according to claim 1, wherein the second reaction gas spray path is formed horizontally in a zig-zag pattern.

* * * * *